(12) United States Patent
Theytaz et al.

(10) Patent No.: US 7,688,309 B2
(45) Date of Patent: Mar. 30, 2010

(54) OPTICAL DISPLACEMENT MODULE AND METHOD TO REDUCE THE SIZE OF AN OPTICAL POINTING DEVICE THEREOF

(75) Inventors: Olivier Theytaz, Savigny (CH); Olivier Mathis, Grimisuat (CH); Baptiste Merminod, Lausanne (CH); Niall White, Co. Tipperary (IE); Kevin Forde, Corks (IE); Denis O'Keeffe, Co. Cork (IE)

(73) Assignee: Logitech Europe S.A. (CH)

( * ) Notice: Subject to any disclaimer, the term of this patent is extended or adjusted under 35 U.S.C. 154(b) by 755 days.

(21) Appl. No.: 10/886,081

(22) Filed: Jul. 6, 2004

(65) Prior Publication Data

US 2006/0007148 A1    Jan. 12, 2006

(51) Int. Cl.
  G09G 5/00    (2006.01)
  G06F 3/033   (2006.01)
(52) U.S. Cl. .................. 345/166; 345/156; 345/163
(58) Field of Classification Search ......... 345/163–167, 345/156
  See application file for complete search history.

(56) References Cited

U.S. PATENT DOCUMENTS

| | | | |
|---|---|---|---|
| 4,751,505 A * | 6/1988 | Williams et al. ............ | 345/166 |
| 5,686,720 A | 11/1997 | Tullis | |
| 5,793,357 A | 8/1998 | Ivey et al. | |
| 6,421,045 B1 | 7/2002 | Venkat et al. | |
| 6,462,330 B1 | 10/2002 | Venkat et al. | |
| 6,531,692 B1 | 3/2003 | Adan et al. | |
| 6,541,762 B2 | 4/2003 | Kang et al. | |
| 6,618,038 B1 * | 9/2003 | Bohn ..................... | 345/164 |
| 6,741,234 B2 | 5/2004 | Son | |
| 6,967,321 B2 * | 11/2005 | Leong et al. ............... | 250/239 |
| 7,068,257 B1 * | 6/2006 | Bohn ..................... | 345/166 |
| 2002/0035701 A1 * | 3/2002 | Casebolt et al. ............ | 713/300 |
| 2003/0142075 A1 * | 7/2003 | Chin ..................... | 345/163 |
| 2005/0116932 A1 * | 6/2005 | Silverbrook ............... | 345/163 |

FOREIGN PATENT DOCUMENTS

| | | |
|---|---|---|
| CN | 1360274 A | 7/2002 |
| CN | 2519334 Y | 10/2002 |
| CN | 1402186 A | 3/2003 |
| CN | 2560031 Y | 7/2003 |
| GB | 2 272 763 A | 5/1994 |

(Continued)

OTHER PUBLICATIONS

Office Action Received for Chinese Patent Application No. 200510082619.2, mailed on Sep. 25, 2006, 4 pages.

(Continued)

*Primary Examiner*—Duc Q Dinh
(74) *Attorney, Agent, or Firm*—The Law Office of Deepti Panchawagh-Jain

(57) ABSTRACT

An optical displacement system for an input device of a host device includes a substrate; an aperture; a light source and a sensor chip attached to the substrate, an illumination optics to direct the light emitted by the light source to a surface of an object. The sensor chip is configured to receive at least part of the light emitted by the light source after the light has been scattered/reflected on the surface of the object.

12 Claims, 10 Drawing Sheets

FOREIGN PATENT DOCUMENTS

WO    WO 00/57352    9/2000

OTHER PUBLICATIONS

Office Action Received for Chinese Patent Application No. 200510082619.2, mailed on Aug. 31, 2007, 2 pages.
Office Action Received for Chinese Patent Application No. 200510082619.2, mailed on May 9, 2008, 2 pages.
Office Action Received for Chinese Patent Application No. 200510082619.2, mailed on May 2, 2009, 1 page.
Office Action Received for Chinese Patent Application No. 200510082619.2, mailed on Aug. 21, 2009, 1 page.

* cited by examiner

OPTICAL DISPLACEMENT MODULE AND METHOD TO REDUCE THE SIZE OF AN OPTICAL POINTING DEVICE THEREOF

BACKGROUND OF THE INVENTION

The present invention relates to an input device based on an optical displacement system.

Optical technology is widely used in various consumer products. One such a product is an input device, e.g., a mouse, having an optical displacement system. The optical displacement system or optical module includes an optical sensor package, an LED, and a lens. The sensor package includes a sensor chip whereon electronic circuits are defined, a plurality of pins, and a package enclosing the chip.

The LED emits light that is scattered on an external surface and received by the sensor chip. The sensor chip uses the received images to determine the movement of the mouse. The movement of the mouse corresponds to the displacement information that is input to a host computer by the mouse. The displacement information is the displacement measured or detected by the mouse.

A mouse having such an optical displacement system is commonly referred to as an optical sensor mouse or optical mouse. The optical mouse is generally preferred over a mouse having a mechanical displacement system that uses a mechanical ball for obtaining displacement information. One reason is that the optical system generally only has solid state devices and does not have moveable parts, e.g., a displacement ball, that is more likely to breakdown from clogging or wear out. Another reason is that the optical system can be made to have a more compact size than a mechanical system, particularly with recent improvements in semiconductor fabrication technologies.

Reducing the size of the displacement system enables the mouse or input device to have a smaller form factor, thereby giving designers more freedom in adapting the internal structure of the product to the user requirements. In addition, a smaller-sized mouse provides easy portability and is desired by many consumers. Accordingly, although already small when compared to a mechanical displacement system, it would still be useful to reduce the size of an optical displacement system.

BRIEF SUMMARY OF THE INVENTION

In one embodiment, an input device for a host includes at least one a selection button to input commands to the host; a housing; and an optical displacement system provided within the housing to provide displacement information to the host. The system includes a printed circuit board (PCB) having an upper surface and a lower surface; a light source provided proximate the lower surface of the PCB, the light source being configured to emit light along a given direction, the direction of the emitted light defining a light source axis; and a sensor package coupled to the PCB and configured to receive at least part of the light emitted by the light source after the light has been scattered on a surface of an object. The sensor chip receives at least part of the scattered light, where the at least part of the scattered light travels along an imaging axis, the imaging axis being defined by the imaging optics and the sensor chip. The light source axis and the imaging axis are not orthogonal to each other.

In one embodiment, an optical displacement system for an input device of a host device includes a light source coupled to a primary printed circuit board (PCB) and configured to emit light along a light source axis; a lens arrangement to direct the light emitted by the light source to a surface of an object; a sensor package joined to a substrate and configured to receive at least part of the light emitted by the light source after the light has been scattered/reflected on the surface of the object; and a first clip attached to a bottom portion of a housing of the input device and extending upward to grip the sensor package to secure a lens-sensor stack to a fixed position, the stack comprising the lens arrangement and the sensor package. The at least part of the light travels along an imaging axis, so that the sensor package may receive the at least part of the light.

In another embodiment, an optical displacement system for an input device of a host device includes a substrate; an aperture; a light source and a sensor chip attached to the substrate, an illumination optics to direct the light emitted by the light source to a surface of an object. The sensor chip is configured to receive at least part of the light emitted by the light source after the light has been scattered/reflected on the surface of the object.

DETAILED DESCRIPTION OF THE INVENTION

The present invention relates to an input device having an optical system that is configured to determine changes in positions or displacements. Accordingly, the present input devices are generally referred to as optical displacement systems. They may, however, also be referred to as an optical positioning system although the embodiments described herein relate to determining displacements of the input device rather than actual positions thereof. Specific embodiments of the present invention are presented for illustrative purposes only. A person skilled in the art will recognize that the present invention may be implemented in many different ways, including by modifying or altering the specific embodiments disclosed herein.

Figure 1:
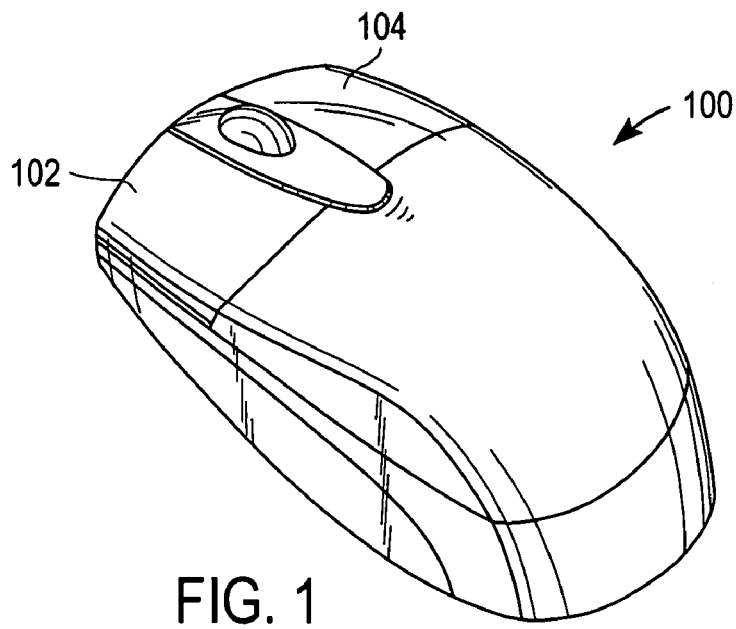
FIG. 1 illustrates a mouse having an optical displacement system.

FIG. 1 illustrates a mouse 100 having an optical displacement system. The mouse is an exemplary input device. The mouse is used to input commands to a host, e.g., a computer. The input commands are entered by providing displacement information according to the movement of the mouse relative to a given point or area associated with a table, pad, or other surface. The displacement information is used to place the cursor on a desired position of a display area of the host. Once this has been done, a desired action may be selected by pressing or touching one of the buttons, e.g., a left or right button 102 or 104, of the mouse.

Figure 2:
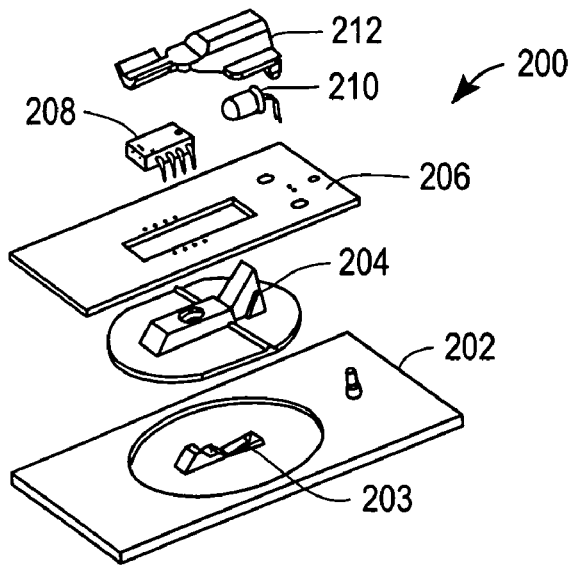
FIG. 2 illustrates an exploded view of an optical displacement system.

FIG. 2 illustrates an exploded view of an optical displacement system 200. A base or bottom case 202 of a mouse has an opening 203 to emit light through it. The light is scattered on the surface of a table or object whereon the mouse is placed. Some of the light is also reflected off the surface at this time. The displacement system 200 receives and processes this scattered/reflected light (forming images of the surface) to obtain the displacement information of the mouse.

The displacement system 200 includes a lens arrangement 204, a printed circuit board (PCB) 206 over the lens, an optical sensor package 208 bonded to an upper surface of the PCB, a light emitting diode (LED) 210 bonded to the upper surface of the PCB, and a clip 212 that holds the sensor package and LED. As used herein, the terms "light source," "LED," and "laser" are used interchangeably. An LED or light source may be visible, infrared, laser, VCSEL, and the like. The lens arrangement generally includes an imaging lens and illumination optics as is well known by those skilled in the art. However, the lens arrangement may refer to only the imaging lens or the illumination optics.

Figure 3:
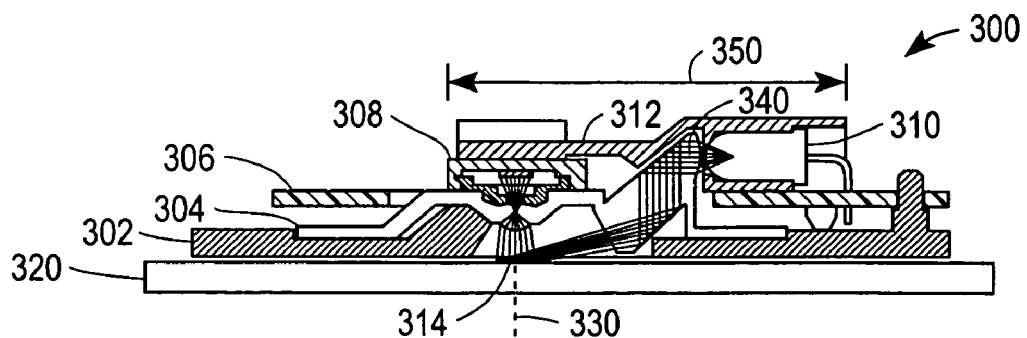
FIG. 3 illustrates a cross-sectional view of an optical displacement system.

FIG. 3 illustrates a cross-sectional view of an optical displacement system 300. The system includes a bottom case 302 of a mouse, a lens arrangement 304, a PCB 306, a sensor package 308, an LED 310, and a bracket 312. The mouse is placed on a surface 320 of an object, e.g., a table or desk. Both the LED and sensor package are placed on the upper side of the PCB. The light emitted by the LED 310 initially travels perpendicular to an imaging axis 330. That is, the light has or travels along a light source axis 340 that is orthogonal to the imaging axis. As used herein, the light source axis is a direction of the light emitted by the LED. The imaging axis is a direction defined by an optical axis of the sensor chip.

The light emitted by the LED is refracted or reflected at least twice before contacting the surface 320 (four times if the refractions associated with entrance and exiting of the lens are counted). The light contacts the surface via an opening 314 of the bottom case. The light is then scattered/reflected on the surface, so that part of the scattered/reflected light is directed to the sensor chip. That is, the scattered/reflected light travels along the imaging axis to enter the sensor chip. The imaging axis is orthogonal to the surface. The sensor chip processes the images of the surface obtained from the scattered/reflected light via the imaging lens to determine the displacement information, e.g., the direction and magnitude of the movement.

A lateral distance 350 defined by the sensor package and the LED is about 32 mm (or about 1.28 inch). Although this is a relatively small dimension, it would be desirable to reduce the lateral distance even more to make the optical system smaller.

Figure 4A:
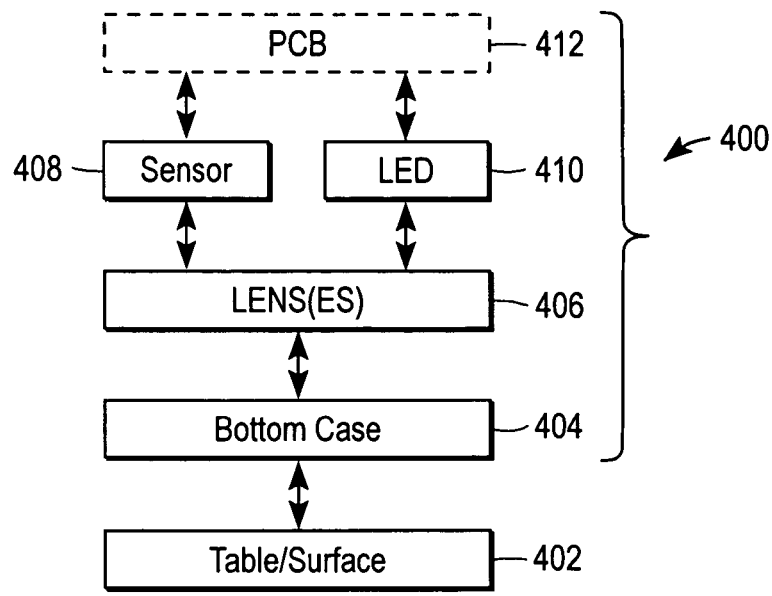
FIG. 4A illustrates a schematic configuration of an optical displacement system according to one embodiment of the present invention.

FIG. 4A illustrates a schematic configuration of an optical displacement system 400 according to one embodiment of the present invention. The system includes a bottom case 404, a lens arrangement 406, a sensor package 408, and a light source or LED 410. The light source is provided at close proximity to the sensor package to reduce the size of the system. The light source could be an LED, laser, or other devices that emit light (including visible and infrared). The lens arrangement may include an imaging lens or component (not shown) that interfaces with the sensor package and an illumination lens or component (not shown) that interfaces with the light source. In one implementation, a PCB 412 is provided over the sensor package and light source. The system 400 is placed on a table or an object to provide the mouse with a tracking surface.

Figure 4B:
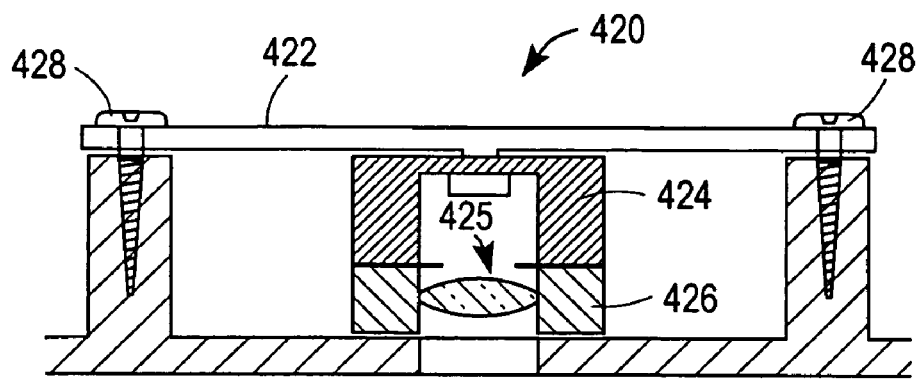
FIG. 4B illustrates an optical system with a plastic bracket to hold the lens and the sensor package to the bottom case.

FIG. 4B illustrates an optical system 420 with a plastic bracket 422 that is placed on top of a sensor package 424 and a lens arrangement 426. A plurality of screws 428 are screwed into the bracket to press this lens-sensor stack in place. An aperture 425 is defined over the lens arrangement 426.

Figure 4C:
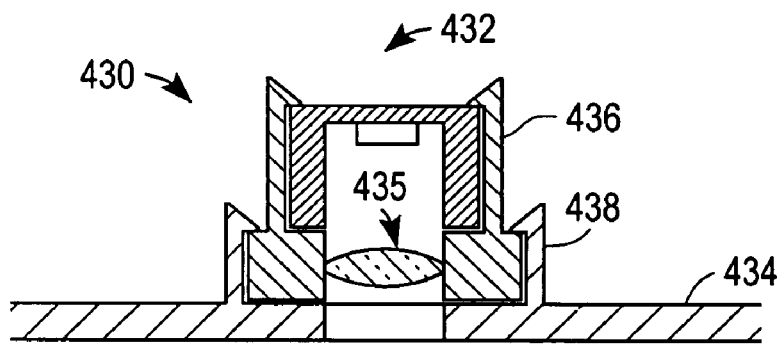
FIGS. 4C-4G illustrate optical systems with clips or staples that hold the sensor package, lens, and bottom case together according to various embodiments of the present invention.

FIG. 4C illustrates an optical system 430 according to one embodiment of the present invention. A lens-sensor stack 432 is held to a bottom case 434 using two sets of clips 436 and 438. The first set 436 that is part of the lens extends upward to grip the sensor package. The second set 438 that is part of the bottom case 434 extends upward to grip the lens (each of the first and second sets may comprise one or more hooks). An aperture 435 is defined over the lens. The front view of the aperture 435 with respect to the sensor chip is not shown for illustrative simplicity. The same applies to FIGS. 4D-4G below.

Figure 4D:
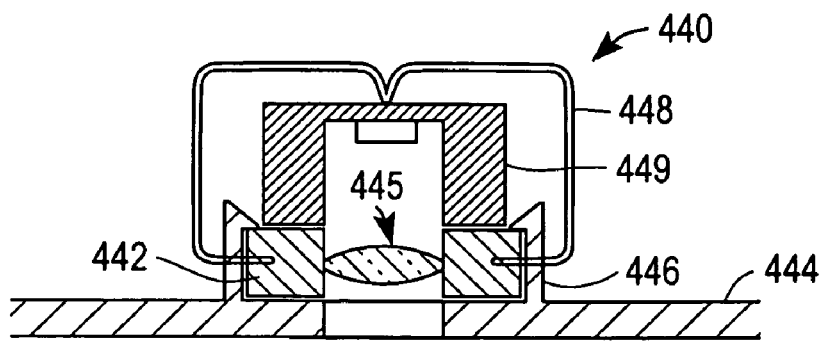

FIG. 4D illustrates an optical system 440 with a lens 442 that is attached to a bottom case 444 with a set of clips 446 that is part of the case bottom. A staple 448 made of spring wire or stamped sheet metal holds a sensor package 449 to the lens 442. An aperture 445 is defined over the lens.

Figure 4E:
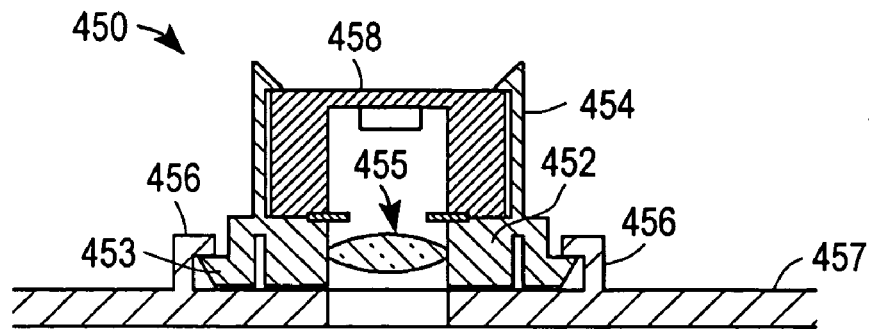

FIG. 4E illustrates an optical system 450 with a lens 452 with two sets of clips 453 and 454. The first set 453 is latched onto hooks 456 of a bottom case 457. The second set 454 grips onto a sensor package 458. An aperture 455 is defined over the lens.

Figure 4F:
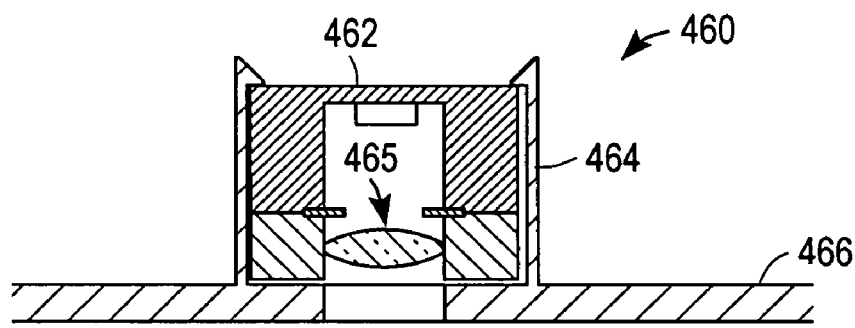

FIG. 4F illustrates an optical system 460 with a lens-sensor stack 462 that is held in place by a single set of clips 464 that extends upward from a bottom case 466. An aperture 465 is defined over the lens.

Figure 4G:
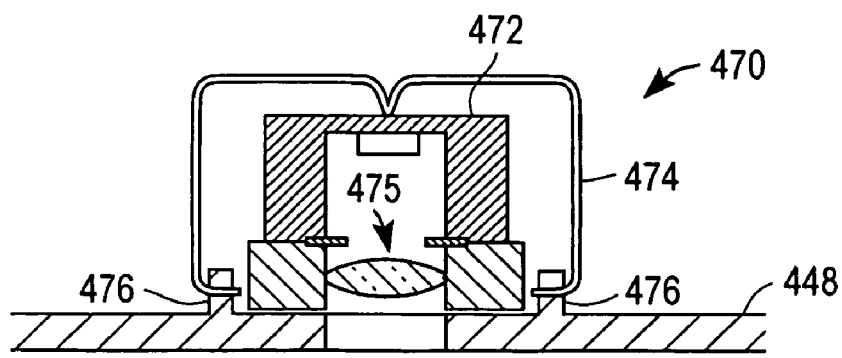

FIG. 4G illustrates an optical system 470 with a lens-sensor stack 472 that is held in place using a staple 474. The staple 474, in turn, is attached to portions 476 of a bottom case 478. An aperture 475 is defined over the lens.

Compared to the conventional configurations, the configurations of the optical systems of FIGS. 4C-4G enable the systems to be assembled faster since screws are not needed and require less components. Also some of them, e.g., the systems 460 and 470, provide more compact designs.

Figure 5A:
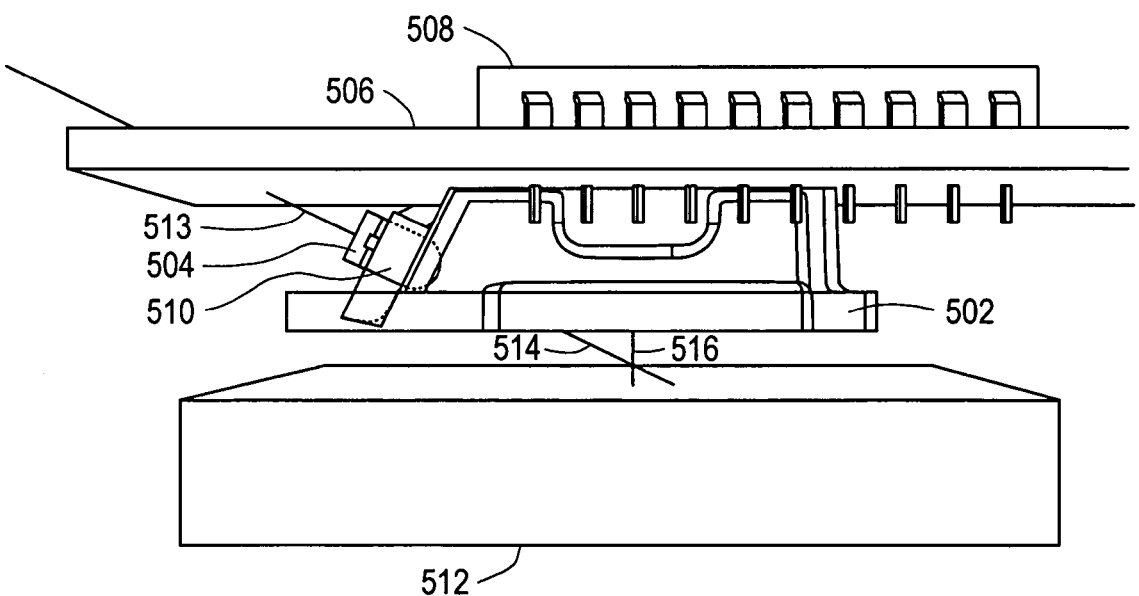
FIG. 5A illustrates an optical displacement system having a light source provided below a PCB according to one embodiment of the present invention.

FIG. 5A illustrates an optical displacement system 500 having an LED (or light source) provided below a PCB according to one embodiment of the present invention. The system 500 includes a lens arrangement 502 and an LED 504 that are provided beneath a primary PCB 506. The lens arrangement provides optics for imaging the surface as well as illumination of the surface at a given angle. A sensor package 508 is provided on top of the PCB 506. In one embodiment, the sensor package is provided on a substrate that is not a PCB, i.e., the numeral 506 is a substrate that is not a PCB.

As used herein, the term "substrate" is any material that can carry, hold, or support a component, e.g., a semiconductor chip. Accordingly, the substrate includes a PCB that has one or more electronic components that have been soldered to the PCB. The substrate may also be a plastic or other body of material to which a component, e.g., sensor package, may be attached by various means, e.g., by soldering, glue, or ultrasonic welding.

The sensor package may be a Dual In Line (DIL) package made of a lead-frame overmolded with opaque plastic. The sensor chip is fitted in a cavity and bonded to the various lead-frame connections and protected by a transparent coating. The sensor package may also be an SMD version, where the electrical connections of the package are contacting copper pads on the PCB and soldered but require no holes, or a DIL or SMD where the sensor chip is mounted on a leadframe and bonded and then overmolded with transparent plastic; or a small carrier (a PCB or ceramic substrate with the sensor chip mounted on the lower side) carrying connections and contacts for the sensor chip connections, or other types.

The sensor package may be provided on the PCB in various different ways, e.g., in a molded package, as a chip mounted directly to the PCB as a Chip-On-Board or via a small carrier (ceramic substrate, mini PCB, other). In certain embodiments, the sensor package may be provided under the PCB by having the pins or leads of the sensor package extend upward rather than downward. The sensor package includes an aperture (not shown) to receive the scattered/reflected light via the lens. An imaging optics (not explicitly shown) is aligned to the aperture of the package for this purpose. A secondary substrate or PCB 510 is joined to the LED 504 to provide power to the LED for emitting light. The system 500 is placed at a given height with respect to a table 512. The system 500 also includes hook or clip that holds the above components in place (see FIGS. 4C-4G).

The light emitted by the LED has a light source axis 513 that defines an acute angle, usually 10-45 degrees (preferably 15-25 degrees), with respect to the surface of the table 512. The light source axis is defined by the LED, e.g., an average direction of the light emitted by the LED. In this system, the illumination axis is substantially aligned with the light source axis. Consequently, the light does not need to be reflected toward the surface unlike in the system 300 where the light is reflected twice to direct it to the surface. The light loss in the system 500, accordingly, is less than that of the system 300 due to the simpler light path and use of less optical surfaces in the present optical system 500.

The light emitted along the light source axis 513 exits the illumination optics and contacts the surface of the table 512 along an illumination axis 514. Upon contact, the light is scattered and reflected on the table. A portion of the scattered light enters the aperture of the sensor package along an imaging axis 516. The imaging axis 516, as defined by the imaging optics of the sensor chip of the sensor package, is substantially orthogonal to the surface of the table and the plane defined by the aperture. Accordingly, the light source axis and the imaging axis are not orthogonal to each other unlike in the system 300. In addition, since the LED 504 is joined to the secondary PCB and is placed below the primary PCB, the system 500 can be made smaller than the optical system 300, e.g., less than about 20 mm.

As used herein, the terms "refracted," "reflected," and "scattered" are used to referred to changing of the path of light. Although these terms have somewhat different meanings in optics, they are used herein interchangeably (particularly in the claims) unless specifically indicated other wise. As used herein, the term "directed" is provided with a broad definition to denote the changing of a path of light in anyway by any material (e.g., by a lens, mirror, or opaque object) and includes the meanings of all three terms above. Similarly, the term "bent" is also used herein to denote the changing of a path of light in anyway.

Figure 5B:
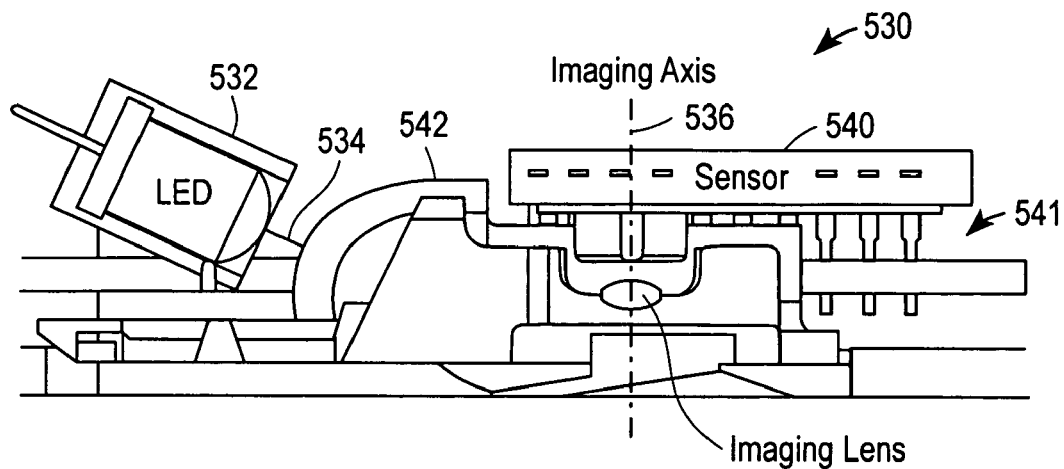
FIG. 5B illustrates a light source that is sloped downward to provide a light source axis that is not orthogonal to an imaging axis, where the light source axis is aligned with an illumination axis according to one embodiment of the present invention.
Figure 5C:
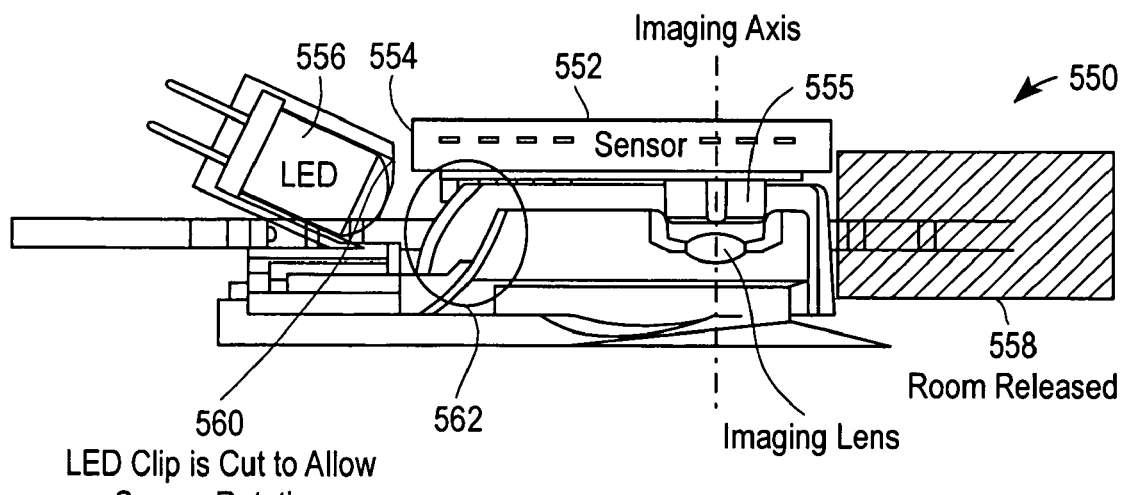
FIG. 5C illustrates an optical system having a sensor package that is rotated about 180 degrees to provide additional room on the right side of the system, where a light source axis is aligned with an illumination axis according to one embodiment of the present invention.

FIGS. 5B and 5C illustrate optical systems that improve upon the system 200 of FIG. 2. FIG. 5B illustrates a light source that is sloped downward to provide a light source axis that is not orthogonal to an imaging axis 536. The system 530, however, has an unused space 541 due to the arrangement/configuration of a sensor package 540 and a lens 542.

FIG. 5C illustrates an optical system 550 having a sensor package 552 that is rotated about 180 degrees to provide an additional room on the right side of the system according to one embodiment of the present invention. By rotating the sensor package around the imaging axis by 180 degrees and having an edge 554 be provided proximate an LED 556, a space 558 is freed for other use. A sensor package aperture 555, on the other hand, is provided further away from the LED. This configuration is made possible by removing a portion 560 of the LED clip and also by redesigning the lens to have a lower height 562, so that the sensor package may be rotated 180 degrees and provided almost entirely over the lens. Accordingly, the system assembly requires a minimal footprint.

Figure 6:
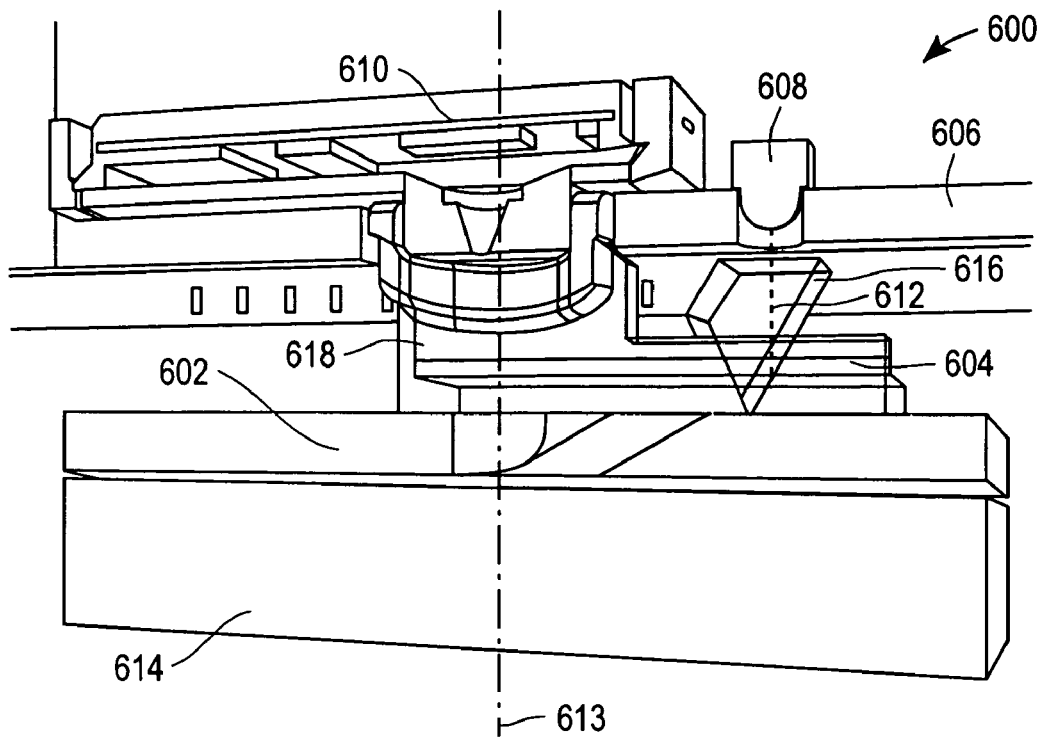
FIG. 6 illustrates an optical displacement system having a light source pointing downward according to one embodiment of the present invention.

FIG. 6 illustrates an optical displacement system 600 having an LED or light source pointing vertically downward according to one embodiment of the present invention. The system includes a bottom case 602, a lens arrangement 604 placed on the bottom case, a substrate (e.g., PCB) 606 provided over the lens arrangement 604, an LED 608 mounted on the PCB 606, and a sensor package 610 mounted on the PCB. The LED and sensor package are placed in close proximity to each other. The LED 608 emits light vertically downward through a hole defined by the PCB. A light source axis corresponding to a path of the emitted light is substantially orthogonal to the surface of a table 614. The LED is a surface mounted device (SMD) LED.

The lens arrangement 604 includes an illumination component 616 that collects the light emitted by the LED and directs (via refraction, reflection or diffraction) it to the surface of the table. The light contacts the surface via an illumination axis (not shown). The light then scatters/reflects off the surface and enters an imaging optics component 618 of the lens arrangement 604. An optical axis of the imaging optics of the sensor chip defines an imaging axis 613. The light source axis 612 and the imaging axis 613 are substantially parallel to each other.

In the present embodiment, the light emitted by the LED is bent only once before contacting the surface, rather than being bent at least twice as in the system 300. Accordingly, the LED and the sensor package may be placed closer together. In addition, the system 600 reduces the light loss due to a simpler light path and the use of less optical surfaces.

Figure 7A:
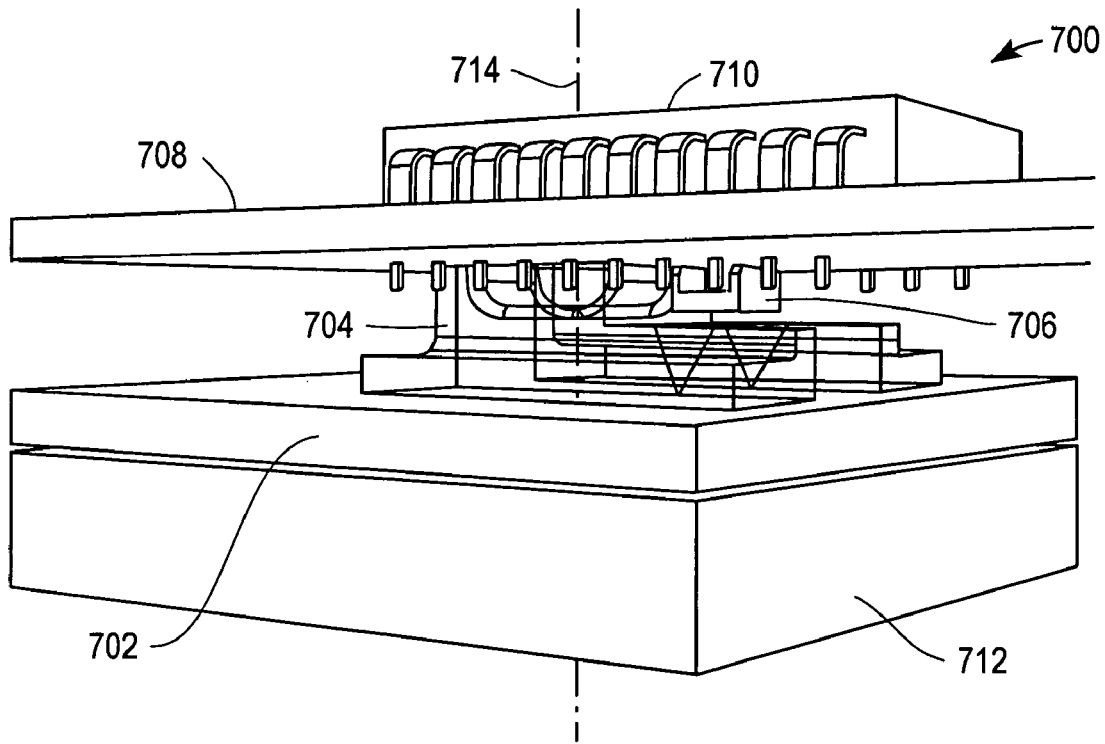
FIGS. 7A, 7B, and 7C illustrate an optical displacement system having a light source placed below a sensor package according to one embodiment of the present invention.

FIG. 7A illustrates an optical displacement system 700 having an LED or light source placed below a sensor package according to one embodiment of the present invention. The system includes a bottom case 702 of a mouse (e.g., mouse 100), a lens arrangement 704 provided over the bottom case 702, an LED 706 mounted on an underside of a substrate (e.g., PCB) 708, and a sensor package 710 mounted on top of the PCB 708. The LED 706 is provided directly below the sensor package to reduce the size of the optical system. The LED emits light vertically toward the surface of a table 712. The light is then directed to the table, so that the light would contact the table at an illumination angle. The light is scattered/reflected from the surface and is received by the sensor chip to process the surface images to obtain displacement information. An optical axis of an imaging optics of the sensor chip defines an imaging axis 714. The imaging axis 714 and the light source axis are parallel to each other in one implementation. In other implementations, these axes are not parallel.

Figure 7B:
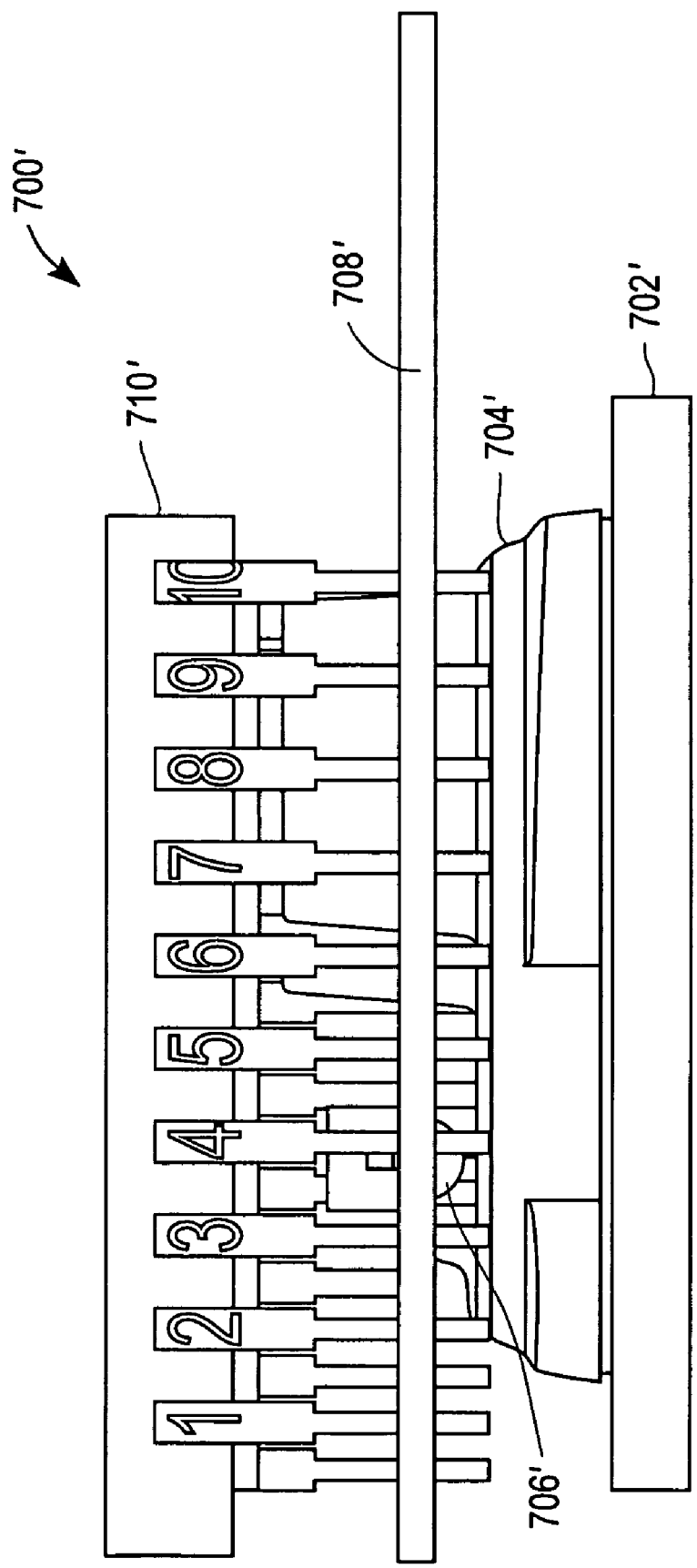
Figure 7C:
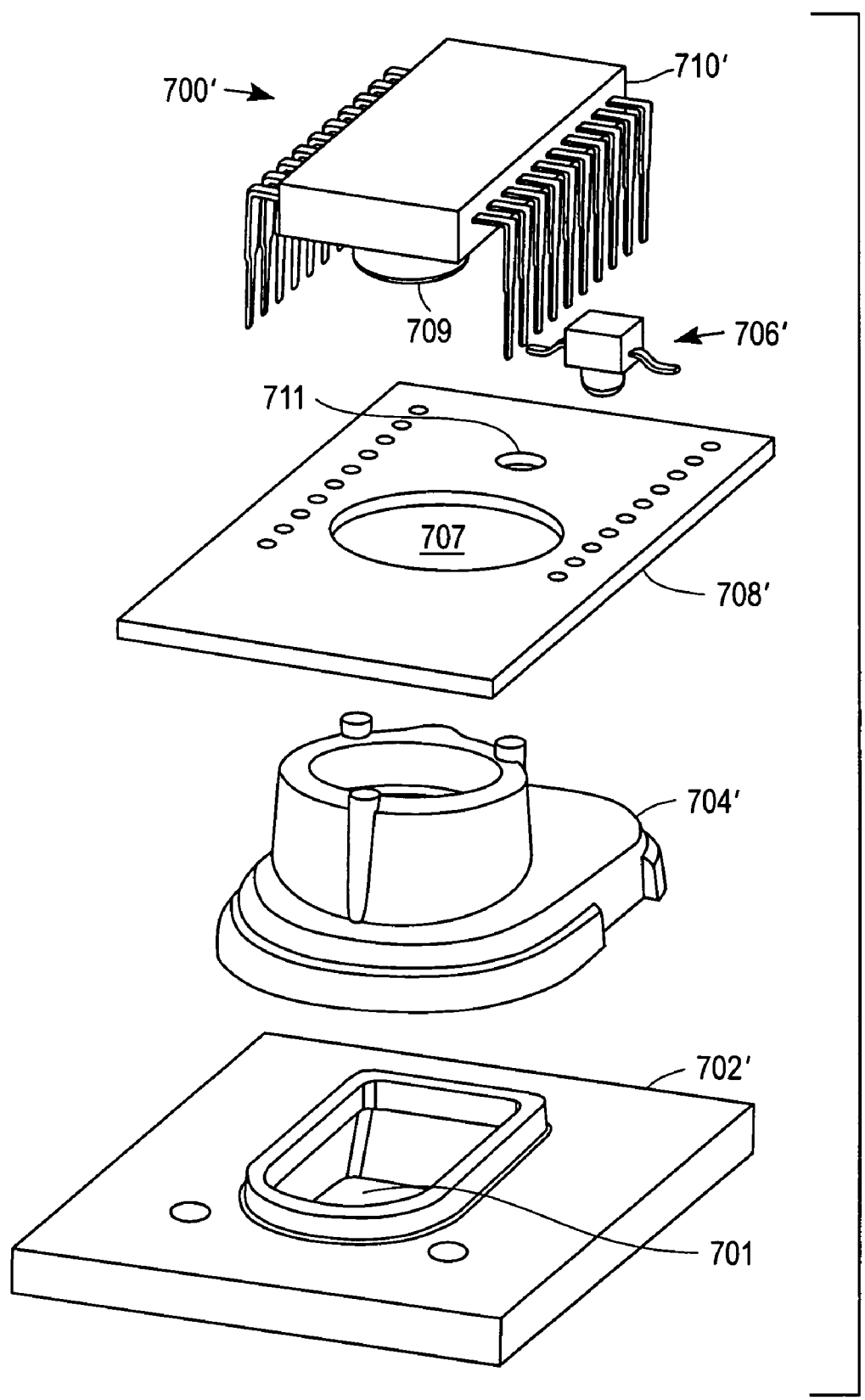

FIG. 7B illustrates an optical system or module 700' that corresponds to the system 700. FIG. 7C illustrates an exploded view of the system 700'. A bottom case 702' includes a first aperture 701 to expose a surface of an object. A lens arrangement 704' is provided on the bottom case. A substrate (e.g., PCB) 708' includes an opening 707 that enables scattered/reflected light to travel through the PCB to a sensor package 710' by the mean of an imaging lens and aperture. The sensor package includes a sensor aperture 709 that is aligned to the PCB opening to receive-the scattered/reflected light. The PCB 708' also includes a positioning hole 711 that is configured to position a light source 706' (e.g., LED) therein. The light source emits light downward through the hole 711 to the surface of the object.

Figure 7D:
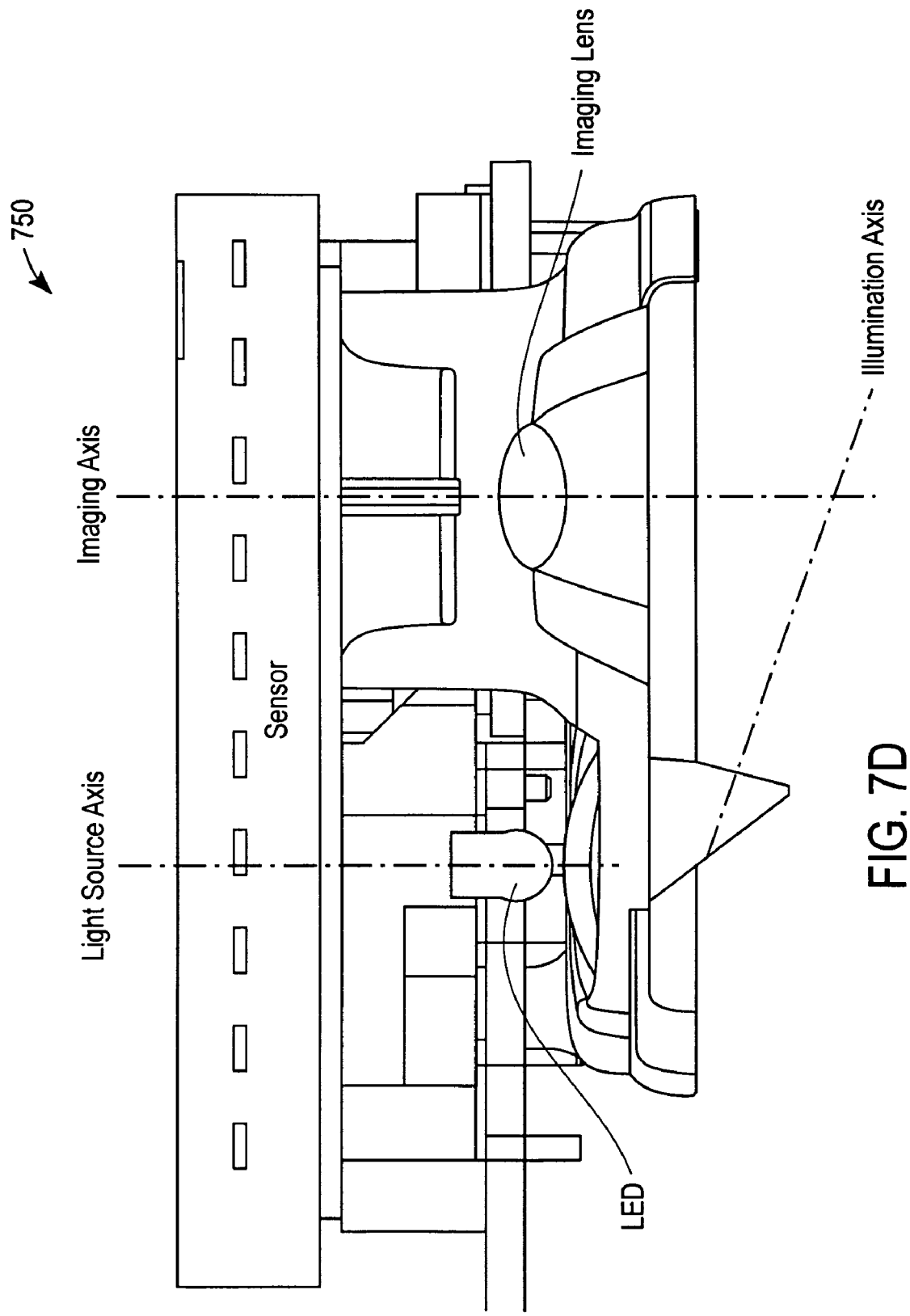
FIG. 7D illustrates an optical system and various optical axes that are associated with the system according to one embodiment of the present invention.

FIG. 7D illustrates an optical system 750 and various optical axes that are associated with the system 750 according to one embodiment of the present invention. The system 750 corresponds to the systems 700 and 700'. As shown in FIG. 7D, a light source axis defined by the LED points vertically downward. The light traveling along this axis is bent to define an illumination axis. The light that has been bent or traveling along the illumination axis then contacts the surface. As a result, the light is scattered, or reflected, or both depending on the surface. At least a portion of the scattered/reflected light is received along an imaging axis by the sensor chip via its aperture. The imaging axis is orthogonal to the surface and parallel to the light source axis in the present implementation.

Figure 8:
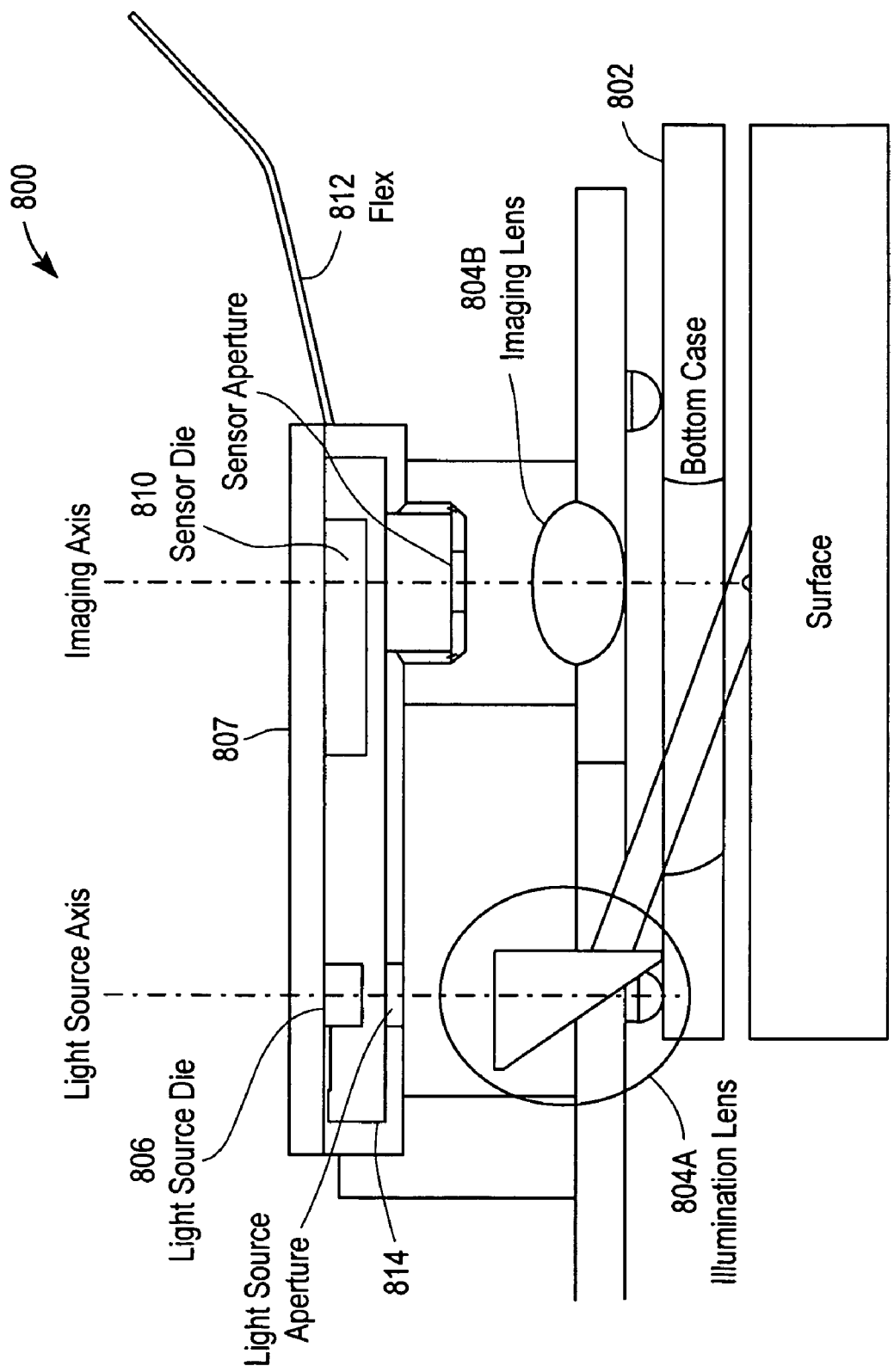
FIG. 8 illustrates an optical displacement system or module having a sensor package including a light source that is connected to the main PCB with a flex cable according to one embodiment of the present invention.

FIG. 8 illustrates an optical displacement system 800 having a sensor package and light source (e.g., LED) placed beneath a PCB according to one embodiment of the present invention. The system 800 includes a bottom case 802 of a mouse, a lens arrangement 804 provided over the case 802, a light source 806 provided below a PCB 807, and a sensor package 810 provided below the PCB 807. In the present embodiment, the PCB 807 is a secondary PCB or substrate that is connected to the main PCB by a flexible flat cable (simple wires connection is also possible). The main PCB may be located anywhere within the mouse in this configuration. Alternatively, the PCB 807 may be the main PCB of the mouse.

The lens arrangement 804 includes an illumination optics 804A and an imaging lens 804B. The light source, sensor package, lens arrangement and PCB together define a module. The module may also include a clip (not shown) to hold these components in place. The module is connected to the rest of the mouse using a flexible electrical connection 812. In the present embodiment, the light source and sensor package are provided on a single packaged device 814 that houses semiconductor dies for the light source and sensor chip.

A sensor package subassembly comprising a sensor die, a light source, a substrate, a cover (mechanical reference and aperture), and an electrical connection (not shown) can be attached to the lens using any of the clips illustrated in FIGS. 4C and 4E. Alternatively, the subassembly can be attached to the lens using a standalone clip or staple, as illustrated in FIG. 4D. In both configurations above, the subassembly and the lens are attached to the bottom case by a clip extending upward from the bottom case (see FIGS. 4C-4G). Alternatively, the subassembly, lens, and bottom case may be held together with a single clip or staple (FIGS. 4F and 4G). Other attachment can be used, e.g., glue, ultrasonic welding, and the like.

In the present embodiment, both the sensor chip and the LED are placed in close proximity to each other below the PCB 807. The LED is a surface mounted device (SMD) in the present implementation. Alternatively, the LED can be in chip form. The light source axis and imaging axis are parallel to each other.

As explained previously, the present invention has been described above in terms of specific embodiments for illustrative purposes only. Accordingly, the scope of the present invention should be interpreted according to the appended claims.

What is claimed is:

1. A module for use in an optical input device to measure the displacement of the optical input device relative to a surface, the module comprising:
   a substrate;
   a light source coupled to the substrate and configured to emit light that travels along a light source axis;
   a sensor chip coupled to the substrate and configured to receive at least part of the light emitted by the light source after the light has been scattered off the surface, the at least part of the light received by the sensor chip traveling along an imaging axis; and
   a cover for the module, the cover comprising:
      a first aperture to allow the light from the light source to travel to the surface, wherein a lens arrangement outside the module directs the light emitted by the light source to the surface, and
      a second aperture to allow the light scattered off the surface to travel to the sensor chip.

2. The module of claim 1, wherein the light source is a laser.

3. The module of claim 1, wherein the light source is an LED.

4. The module of claim 3, wherein the LED is pre-packaged.

5. The module of claim 1, wherein the light source axis and the imaging axis are parallel to each other.

6. The module of claim 1, wherein the module is snappable onto a bottom portion of a housing of the optical input device.

7. The module of claim 1, wherein the module is snappable onto the lens arrangement, which is attached to a bottom portion of a housing of the optical input device.

8. The module of claim 1, wherein the lens arrangement directs the scattered light to the sensor chip.

9. The module of claim 1, wherein the module is connectable to a printed circuit board (PCB) in the optical input device.

10. The module of claim 9, wherein the module is connected to the PCB using a flexible flat cable.

11. The module of claim 1, wherein the substrate is a PCB.

12. The module of claim 3, wherein the LED is chip-on-boarded.

* * * * *